United States Patent
Sawada et al.

(10) Patent No.: US 11,563,168 B2
(45) Date of Patent: Jan. 24, 2023

(54) MAGNETIC MEMORY DEVICE THAT SUPPRESSES DIFFUSION OF ELEMENTS

(71) Applicant: Kioxia Corporation, Tokyo (JP)

(72) Inventors: Kazuya Sawada, Seoul (KR); Young Min Eeh, Seongnam-si (KR); Tadaaki Oikawa, Seoul (KR); Eiji Kitagawa, Seoul (KR); Taiga Isoda, Seoul (KR)

(73) Assignee: KIOXIA CORPORATION, Tokyo (JP)

( * ) Notice: Subject to any disclaimer, the term of this patent is extended or adjusted under 35 U.S.C. 154(b) by 211 days.

(21) Appl. No.: 17/016,230

(22) Filed: Sep. 9, 2020

(65) Prior Publication Data
US 2021/0288240 A1    Sep. 16, 2021

(30) Foreign Application Priority Data

Mar. 10, 2020    (JP) .............................. JP2020-040615

(51) Int. Cl.
*H01L 43/02*    (2006.01)
*H01L 27/22*    (2006.01)
(Continued)

(52) U.S. Cl.
CPC ............ *H01L 43/02* (2013.01); *G11C 11/161* (2013.01); *H01F 10/3272* (2013.01);
(Continued)

(58) Field of Classification Search
CPC ..... H01L 43/02; H01L 27/224; H01L 27/228; H01L 43/10; G11C 11/161; H01F 10/3272; H01F 10/329
(Continued)

(56) References Cited

U.S. PATENT DOCUMENTS

| 8,995,181 B2 | 3/2015 | Watanabe et al. |
| 9,130,143 B2 | 9/2015 | Nagase et al. |

(Continued)

FOREIGN PATENT DOCUMENTS

| JP | 2013069862 A | 4/2013 |
| JP | 6365901 B2 | 7/2018 |

OTHER PUBLICATIONS

U.S. Appl. No. 16/813,827; First Named Inventor: Taiga Isoda; Title: "Magnetoresistive Memory Device"; filed Mar. 10, 2020.

(Continued)

*Primary Examiner* — Jami Valentine Miller
(74) *Attorney, Agent, or Firm* — Holtz, Holtz & Volek PC

(57) ABSTRACT

A magnetic memory device includes a magnetoresistance effect element including a first, second, and third ferromagnetic layer, a first non-magnetic layer between the first and second ferromagnetic layer, and a second non-magnetic layer between the second and third ferromagnetic layer. The second ferromagnetic layer is between the first and third ferromagnetic layer. The third ferromagnetic layer includes a fourth ferromagnetic layer in contact with the second non-magnetic layer, a third non-magnetic layer, and a fourth non-magnetic layer between the fourth ferromagnetic layer and the third non-magnetic layer. The first non-magnetic layer includes an oxide including magnesium (Mg). A melting point of the fourth non-magnetic layer is higher than the third non-magnetic layer.

16 Claims, 12 Drawing Sheets

(51) Int. Cl.
   *H01F 10/32*     (2006.01)
   *G11C 11/16*     (2006.01)
   *H01L 43/10*     (2006.01)
   *H01L 43/12*     (2006.01)

(52) U.S. Cl.
   CPC .......... *H01L 27/224* (2013.01); *H01L 27/228* (2013.01); *H01L 43/10* (2013.01); *H01F 10/329* (2013.01); *H01L 43/12* (2013.01)

(58) Field of Classification Search
   USPC ........................................................ 257/421
   See application file for complete search history.

(56) References Cited

U.S. PATENT DOCUMENTS

| | | |
|---|---|---|
| 9,142,756 B2 | 9/2015 | Nagamine et al. |
| 9,178,137 B2 | 11/2015 | Eeh et al. |
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |
| 9,293,695 B2 | 3/2016 | Ueda et al. |
| 9,461,240 B2 | 10/2016 | Sawada et al. |
| 9,608,199 B1 | 3/2017 | Kitagawa |
| 9,620,561 B2 | 4/2017 | Nagase et al. |
| 9,640,584 B2 | 5/2017 | Nagamine et al. |
| 9,647,203 B2 | 5/2017 | Kitagawa et al. |
| 9,705,076 B2 | 7/2017 | Nagamine et al. |
| 9,741,928 B2 | 8/2017 | Ueda et al. |
| 9,947,862 B2 | 4/2018 | Watanabe et al. |
| 9,991,313 B2 | 6/2018 | Watanabe et al. |
| 10,026,888 B2 | 7/2018 | Ochiai et al. |
| 10,026,891 B2 | 7/2018 | Nagase et al. |
| 10,090,459 B2 | 10/2018 | Watanabe et al. |
| 10,103,318 B2 | 10/2018 | Watanabe et al. |
| 10,170,519 B2 | 1/2019 | Eeh et al. |
| 10,211,256 B2 | 2/2019 | Kitagawa |
| 10,263,178 B2 | 4/2019 | Sawada et al. |
| 10,305,027 B2 * | 5/2019 | Kato ........................ H01L 43/08 |
| 10,388,343 B2 * | 8/2019 | Oikawa ................... H01L 43/02 |
| 10,468,170 B2 * | 11/2019 | Eeh ......................... H01L 43/12 |
| 10,510,950 B2 | 12/2019 | Watanabe et al. |
| 2014/0284534 A1 | 9/2014 | Nagase et al. |
| 2014/0284733 A1 * | 9/2014 | Watanabe ............. H01F 41/307 257/421 |
| 2016/0130693 A1 | 5/2016 | Sawada et al. |
| 2016/0260773 A1 | 9/2016 | Kitagawa et al. |
| 2017/0263679 A1 | 9/2017 | Ozeki et al. |
| 2017/0263680 A1 * | 9/2017 | Yoshino .................. H01L 43/08 |
| 2018/0076262 A1 | 3/2018 | Eeh et al. |
| 2018/0205006 A1 | 7/2018 | Watanabe et al. |
| 2018/0277745 A1 | 9/2018 | Oikawa et al. |
| 2018/0309048 A1 | 10/2018 | Ochiai et al. |
| 2019/0019841 A1 | 1/2019 | Eeh et al. |
| 2019/0296226 A1 * | 9/2019 | Eeh ......................... H01L 27/228 |
| 2020/0075671 A1 | 3/2020 | Ozeki et al. |
| 2020/0082857 A1 * | 3/2020 | Eeh ......................... H01L 43/10 |
| 2020/0091410 A1 | 3/2020 | Kitagawa et al. |
| 2020/0294567 A1 * | 9/2020 | Oikawa ................... H01L 43/08 |
| 2020/0302987 A1 | 9/2020 | Sawada et al. |
| 2020/0303632 A1 * | 9/2020 | Watanabe ........... H01F 10/3272 |
| 2021/0043226 A1 * | 2/2021 | Inubushi ............... H01F 10/325 |
| 2021/0210676 A1 * | 7/2021 | Prasad ................ H01F 10/3259 |
| 2021/0210677 A1 * | 7/2021 | Prasad ................... H01F 10/329 |
| 2021/0225421 A1 * | 7/2021 | Mihajlovic ............. H01L 43/10 |
| 2021/0320245 A1 * | 10/2021 | Kalitsov ............... H01F 10/329 |

OTHER PUBLICATIONS

U.S. Appl. No. 16/816,880; First Named Inventor: Tadaaki Oikawa; Title: "Magnetic Device"; filed Mar. 12, 2020.
U.S. Appl. No. 16/816,961; First Named Inventor: Kazuya Sawada; Title:"Magnetic Memory Device"; filed Mar. 12, 2020.
U.S. Appl. No. 17/016,256; First Named Inventor: Taiga Isoda; Title: "Memory Device"; filed Sep. 9, 2020.
U.S. Appl. No. 17/016,272; First Named Inventor: Hisanori Aikawa; Title: "Semiconductor Memory Device and Memory System"; filed Sep. 9, 2020.

* cited by examiner

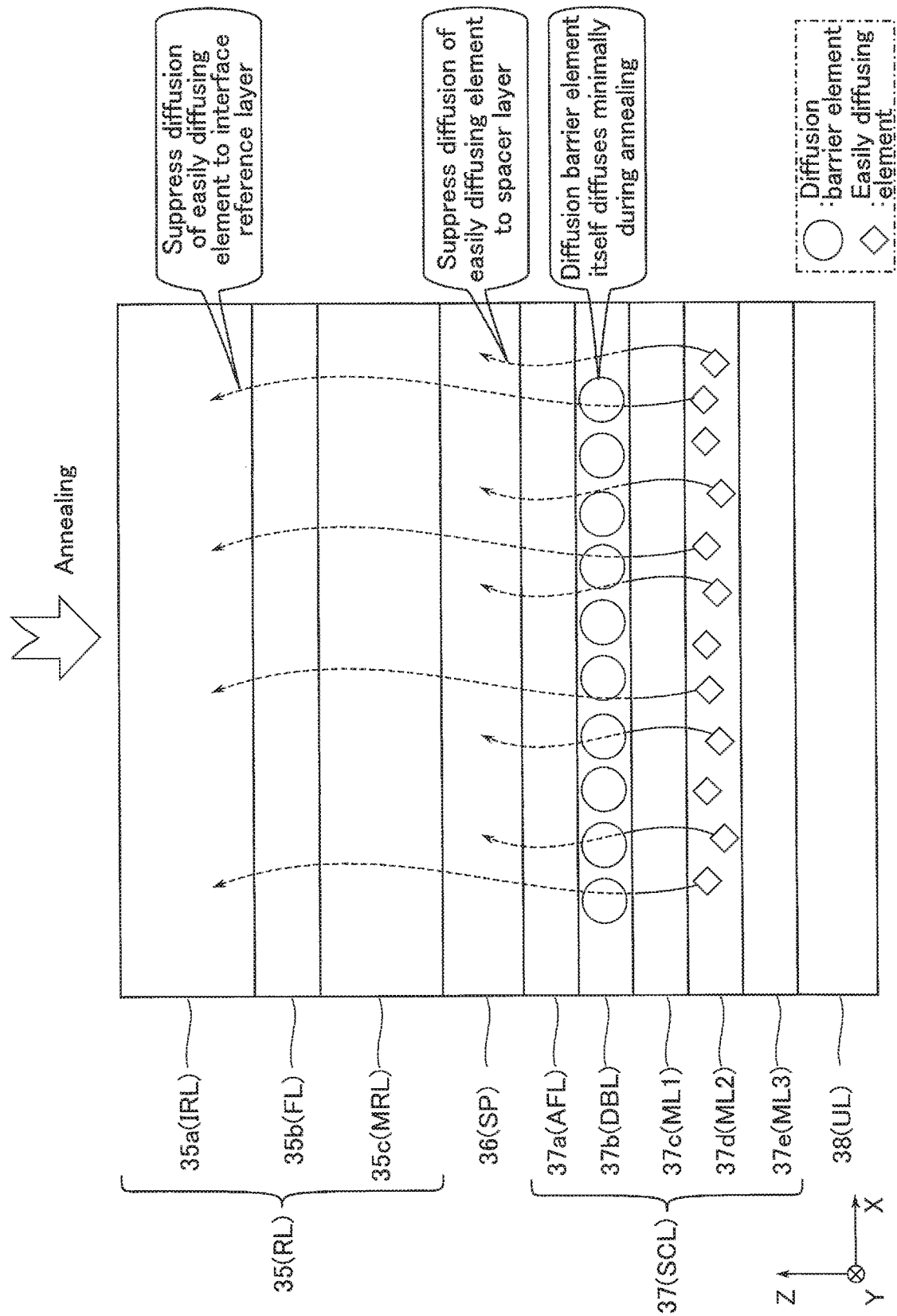
F I G. 7

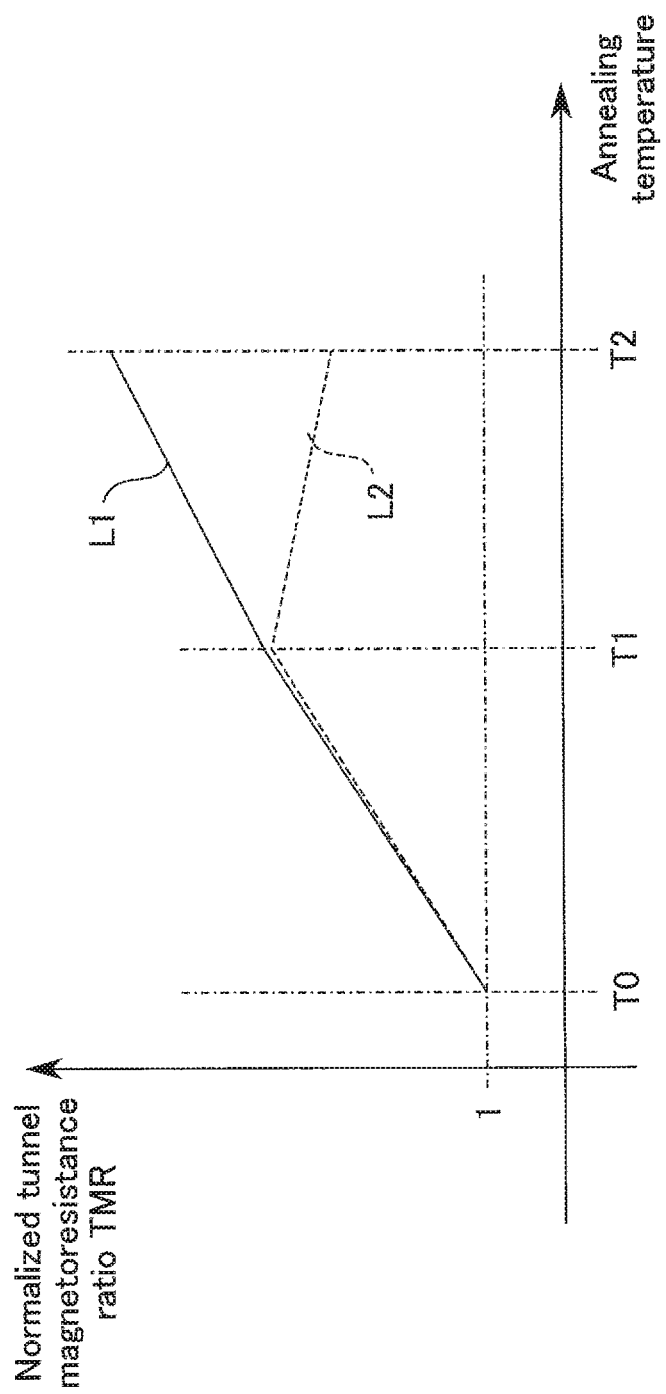
F I G. 8

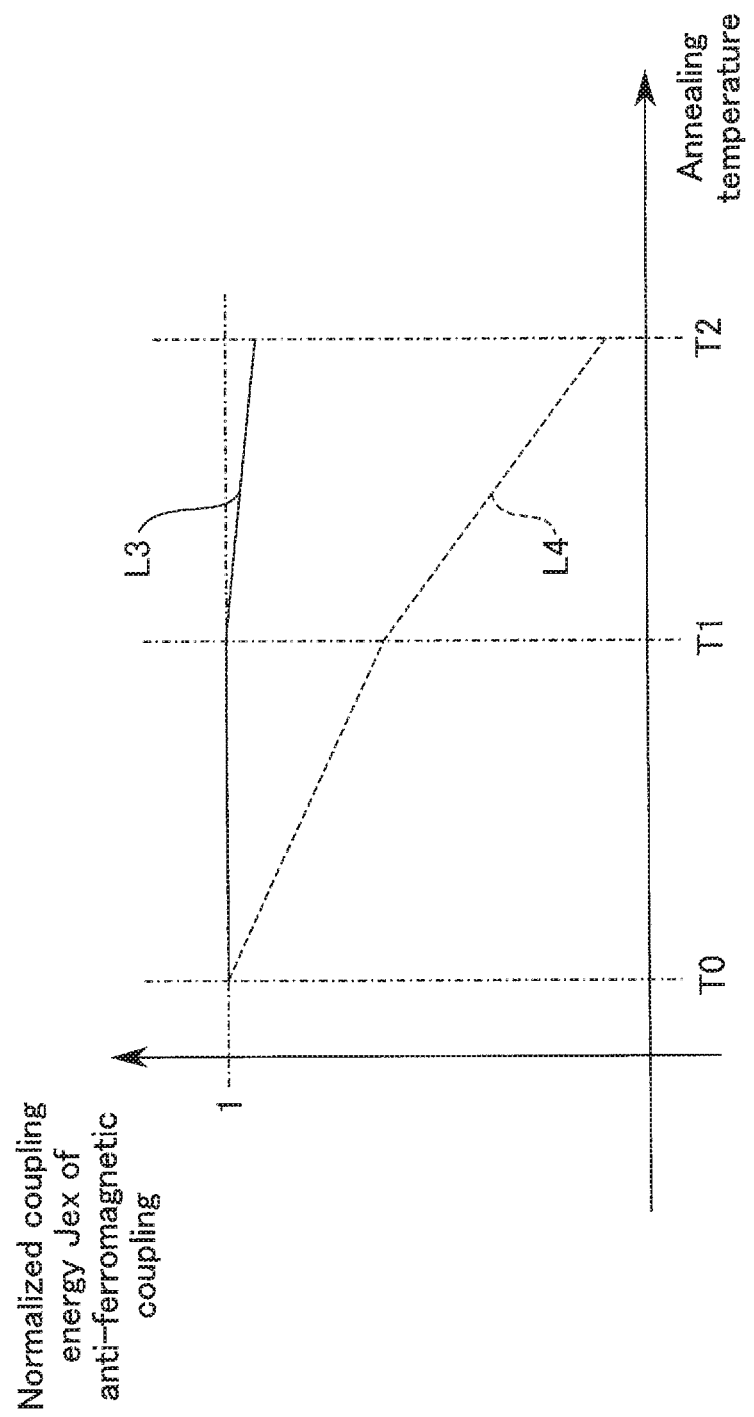
F I G. 9

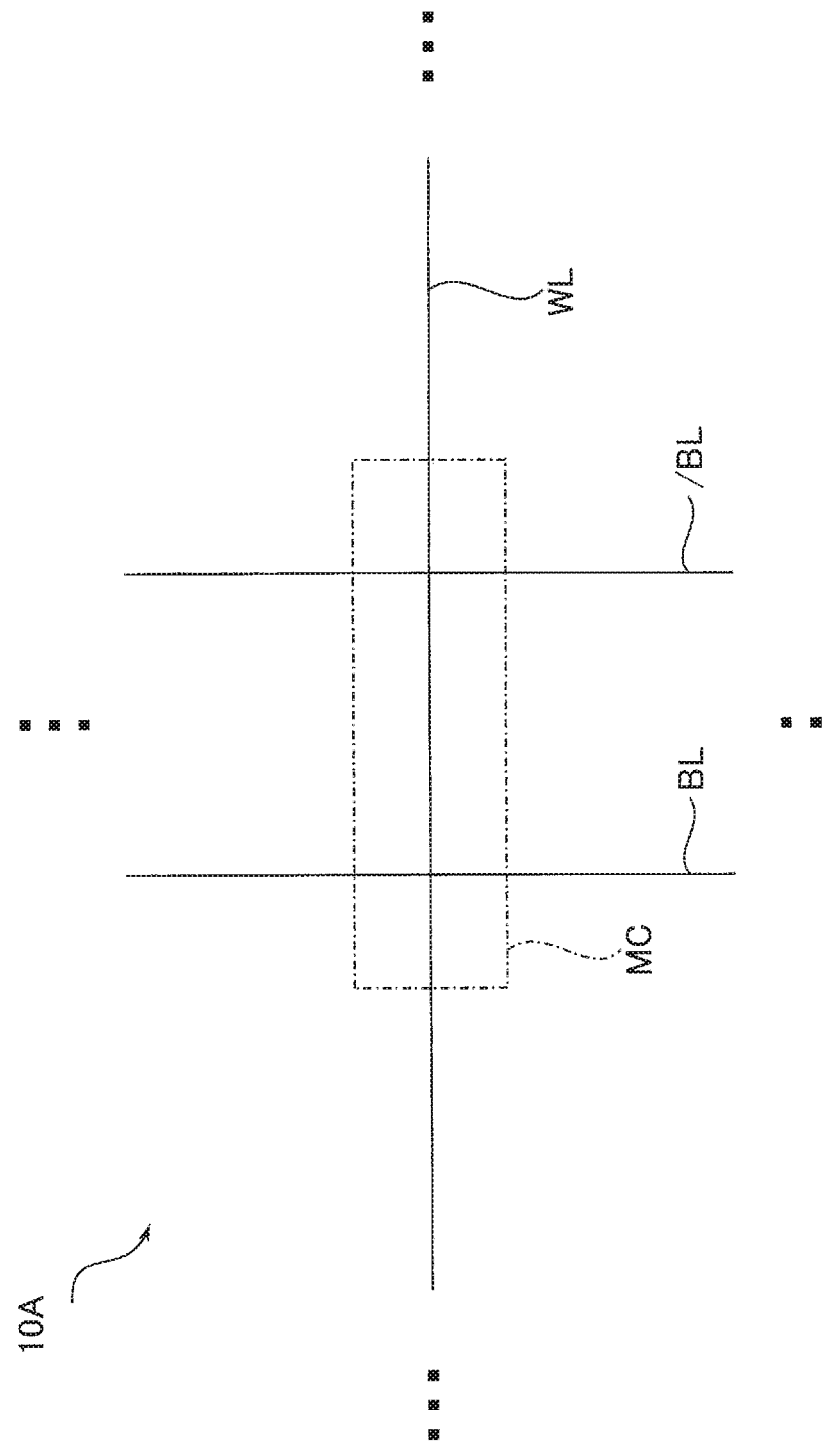

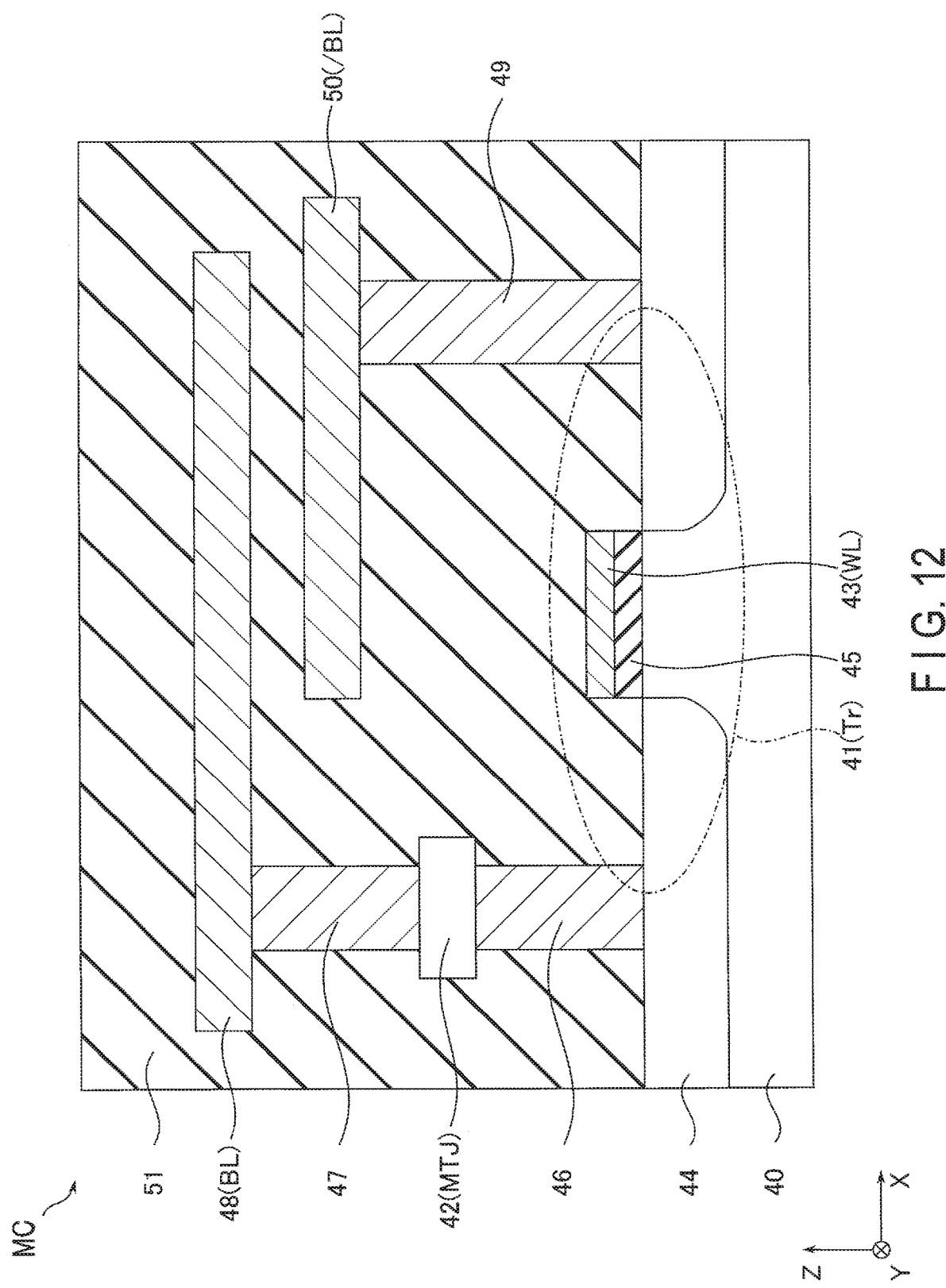

MAGNETIC MEMORY DEVICE THAT SUPPRESSES DIFFUSION OF ELEMENTS

CROSS-REFERENCE TO RELATED APPLICATIONS

This application is based upon and claims the benefit of priority from Japanese patent application No. 2020-040615, filed Mar. 10, 2020, the entire contents of which are incorporated herein by reference.

FIELD

Embodiments described herein relate generally to a magnetic memory device.

BACKGROUND

A magnetic memory device (magnetoresistive random access memory, or MRAM) that incorporates a magnetoresistance effect element as a storage element has been known.

BRIEF DESCRIPTION OF THE DRAWINGS

FIG. 7 is a schematic diagram for explaining a method for manufacturing a magnetic tunnel junction element of the magnetic memory device according to the present embodiment.

FIG. 8 is a diagram for explaining effects according to the present embodiment.

FIG. 9 is a diagram for explaining effects according to the present embodiment.

FIG. 11 is a circuit diagram for explaining a structure of a memory cell array in a magnetic memory device according to a second modification.

FIG. 12 is a cross sectional view for explaining a structure of a memory cell in the magnetic memory device according to the second modification.

DETAILED DESCRIPTION

In general, according to one embodiment, a magnetic memory device includes a magnetoresistance effect element. The magnetoresistance effect element includes a first ferromagnetic layer, a second ferromagnetic layer, a third ferromagnetic layer, a first non-magnetic layer between the first ferromagnetic layer and the second ferromagnetic layer, and a second non-magnetic lager between the second ferromagnetic layer and the third ferromagnetic layer. The second ferromagnetic layer is between the first ferromagnetic layer and the third ferromagnetic layer. The third ferromagnetic layer includes a fourth ferromagnetic layer in contact with the second non-magnetic layer, a third non-magnetic layer, and a fourth non-magnetic layer between the fourth ferromagnetic layer and the third non-magnetic layer. The first non-magnetic layer includes an oxide including magnesium (Mg). A melting point of the fourth non-magnetic layer is higher than a melting point of the third non-magnetic layer.

The embodiments of the present invention will be explained with reference to the drawings. In the following explanation, components having the same functions and structures will be referred to by the same reference symbol. If structural components having the same reference symbols need to be distinguished from each other, letters or numerals may be added to the symbols. If the structural components do not particularly need to be distinguished from each other, only the common symbols are used without adding letters or numerals thereto. The additional letters or numerals are not limited to a superscript or subscript, but may be lowercase letters and indices indicating the arrangement order attached to the end of a reference symbol.

1. Embodiment

A magnetic memory device according to a present embodiment will be explained. The magnetic memory device according to the present embodiment may include a magnetic memory device adopting a perpendicular magnetic recording system which uses, as a resistance change element, an element that demonstrates a magnetoresistance effect in a magnetic tunnel junction (MTJ) (referred to as a "magnetoresistance effect element" or "MTJ element"). In the following description, the aforementioned magnetic tunnel junction element will be described as an example of the magnetoresistance effect element, which is the memory element using the magnetoresistance effect.

1.1 Structure

First, a structure of a magnetic memory device according to the present embodiment will be explained.

1.1.1 Magnetic Memory Device

Figure 1:
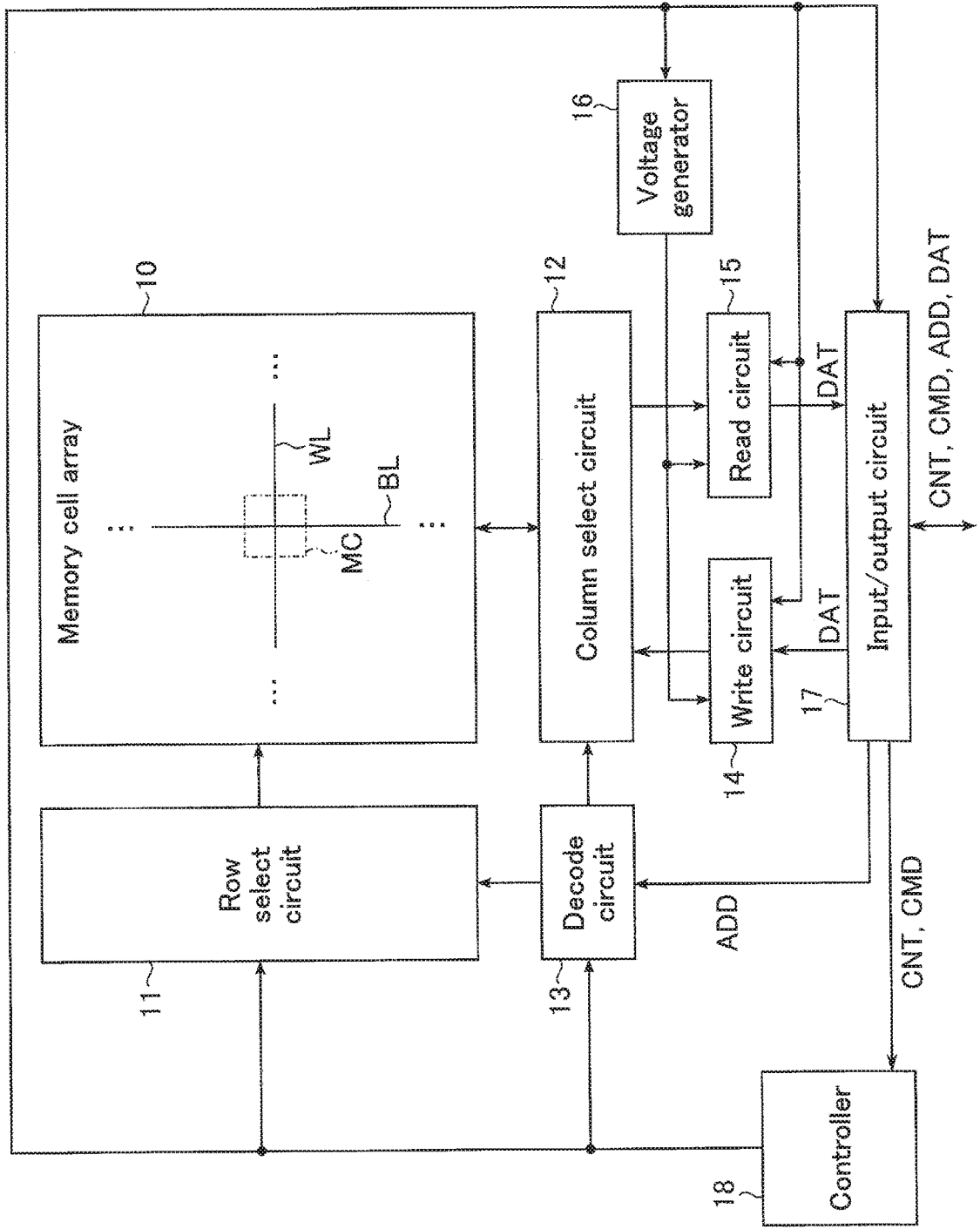
FIG. 1 is a block diagram for explaining a structure of a magnetic memory device according to an embodiment.

FIG. 1 is a block diagram showing the structure of the magnetic memory device according to the present embodiment. As illustrated in FIG. 1, a magnetic memory device 1 includes a memory cell array 10, a row select circuit 11, a column select circuit 12, a decode circuit 13, a write circuit 14, a read circuit 15, a voltage generator 16, an input/output circuit 17, and a controller 18.

The memory cell array 10 includes a plurality of memory cells MC, each of which is associated with a pair of a row and a column. In particular, the memory cells MC of the same row are coupled to the same word line WL, and the memory cells MC of the same column are coupled to the same bit line BL.

The row select circuit 11 is coupled to the memory cell array 10 by way of word lines WL. The row select circuit 11 receives decoding results (row address) of an address ADD from the decode circuit 13. The row select circuit 11 sets a word line WL corresponding to the row indicated by the decoding results of the address ADD to a selected state.

Hereinafter, a word line WL that is set to a selected state will be referred to as a "selected word line WL". Word lines WL other than the selected word line WL will be referred to as "non-selected wordlines WL".

The column select circuit 12 is coupled to the memory cell array 10 by way of bit lines BL. The column select circuit 12 receives decoding results (column address) of the address ADD from the decode circuit 13. The column select circuit 12 sets, to a selected state, a bit line BL corresponding to the column indicated by the decoding results of address ADD. Hereinafter, a bit line BL that is set to a selected state will be referred to as a "selected bit line BL". Bit lines BL other than the selected bit line BL will be referred to as "non-selected bit lines BL".

The decode circuit 13 decodes the address ADD received from the input/output circuit 17. The decode circuit 13 supplies the decoding results of the address ADD to the row select circuit 11 and column select circuit 12. The address ADD includes addresses of a column and row to be selected.

The write circuit 14 writes data into memory cells MC. The write circuit 14 may include a write driver (not shown).

The read circuit 15 reads data from memory cells MC. The read circuit 15 may include a sense amplifier (not shown).

The voltage generator 16 generates voltages for the operations of the memory cell array 10 using a power supply voltage supplied from the outside (not shown) of the magnetic memory device 1. For example, the voltage generator 16 generates voltages required for a write operation and outputs them to the write circuit 14. The voltage generator 16 also generates voltages required for a read operation and outputs them to the read circuit 15.

The input/output circuit 17 transfers an address ADD received from the outside of the magnetic memory device 1, to the decode circuit 13. The input/output circuit 17 also transfers a command CMD received from the outside of the magnetic memory device 1, to the controller 18. The input/output circuit 17 transmits and receives various control signals CNT between the controller 18 and the outside of the magnetic memory device 1. The input/output circuit 17 transfers, to the write circuit 14, the data DAT received from the outside of the magnetic memory device 1, and outputs, to the outside of the magnetic memory device 1, the data DAT transferred from the read circuit 15.

The controller 18 controls the operations of the row select circuit 11, column select circuit 12, decode circuit 13, write circuit 14, read circuit 15, voltage generator 16, and input/output circuit 17 in the magnetic memory device 1, in accordance with the control signals CNT and command CMD.

1.1.2 Memory Cell Array

Figure 2:
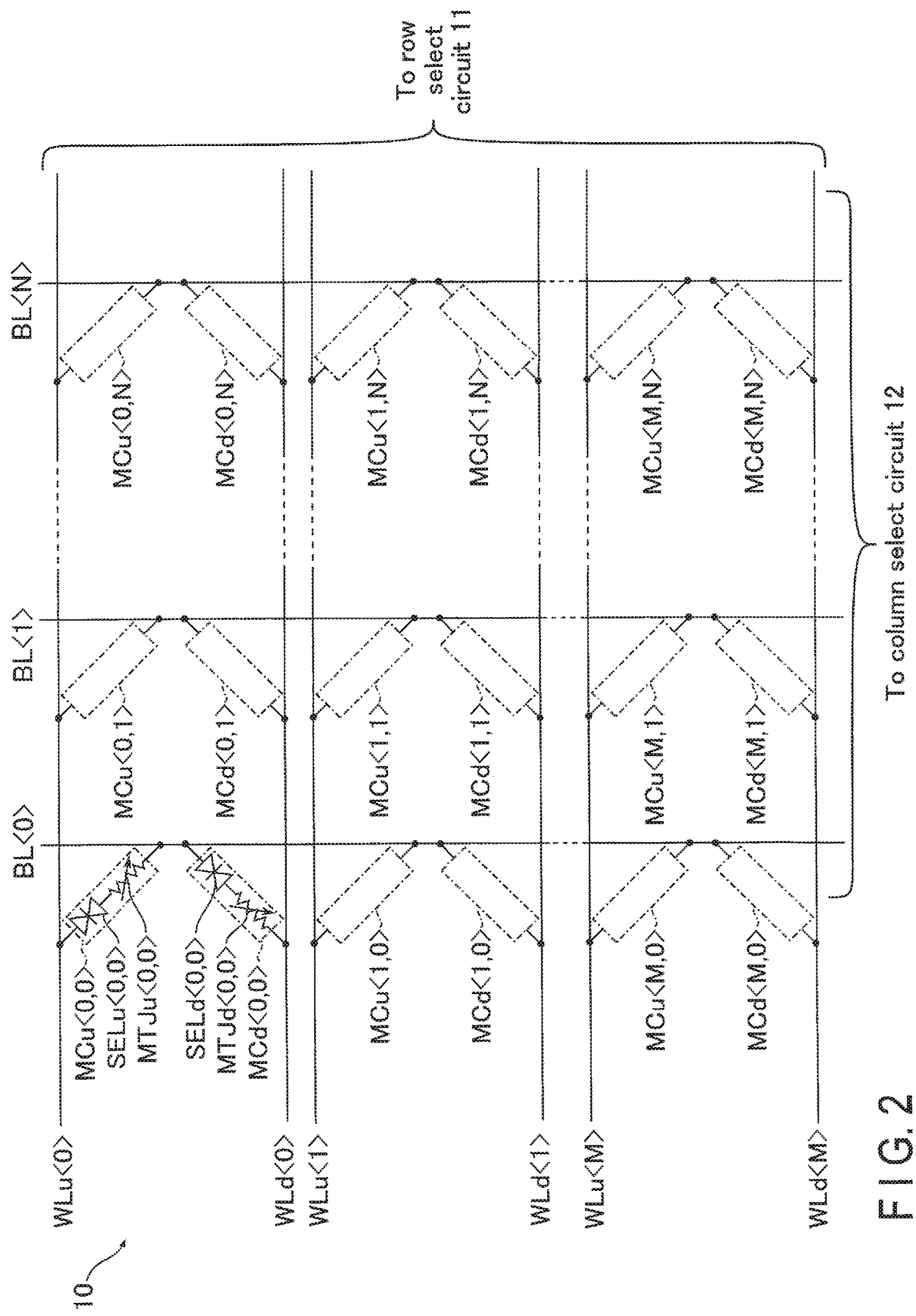
FIG. 2 is a circuit diagram for explaining a structure of a memory cell array in the magnetic memory device according to the present embodiment.

Next, the structure of a memory cell array in the magnetic memory device according to the present embodiment will be explained with reference to FIG. 2, which is a circuit diagram of the structure of a memory cell array in the magnetic memory device according to the present embodiment. In FIG. 2, the word lines WL are classified by lowercase letters ("u" or "d") and angle-bracketed indexes.

As shown in FIG. 2, memory cells MC (MCu and MCd) are arranged to form a matrix in the memory cell array 10, and each of the memory cells MC is associated with a pair of a bit line BL of the bit lines BL (BL<0>, BL<1>, BL<N>)) and a word line WL of the word lines WLd (WLd<0>, WLd<1>, ..., WLd<M>) and WLu (WLu<0>, WLu<1>, ..., WLu<M>) (where M and N are any integers).

That is, a memory cell MCd<i,j> ($0 \leq i \leq M$, $0 \leq j \leq N$) is coupled between a word line WLd<i> and a bit line BL<j>, and a memory cell MCu<i,j> is coupled between a word line WLu<i> and a bit line BL<j>.

The alphabetic characters "u" and "d" are attached simply for the sake of convenience to indicate a memory cell MC being arranged, for example, above or beneath a bit line BL. The three-dimensional structure of the memory cell array 10 will be discussed later.

The memory cell MCd<i,j> includes a switching element SELd<i,j> and a magnetic tunnel junction element MTJd<i,j> coupled in series with each, other. The memory cell MCu<i,j> includes a switching element SELu<i,j> and a magnetic tunnel junction element MTJu<i,j> coupled in series to each other.

The switching element SEL is provided with a function to perform switching at the time of writing and reading data to and from the corresponding magnetic tunnel junction element MTJ, in order to control the current supply to the magnetic tunnel junction element MTJ. In particular, when the voltage applied to the memory cell MC is lower than the threshold voltage Vth, the switching element SEL of a memory cell MC serves as a highly resistive insulator which interrupts the current (switching to an OFF state), while when the voltage exceeds the threshold voltage Vth, the switching element SEL serves as a low resistive conductor, which passes the current (switching to an ON state). That is, the switching element SEL is provided with a function of switching between interrupting and passing of the current in accordance with the voltage applied to the memory cell MC, regardless of the direction of the current flow.

The switching element SEL may be a two-terminal switching element. When the voltage applied between the two terminals is lower than the threshold voltage, this switching element is in a "high resistance" state, being electrically non-conductive, for example. When the voltage applied between the two terminals is higher than or equal to the threshold voltage, the switching element is turned to a "low resistance" state, being electrically conductive, for example. The switching element may have this function, regardless of the polarity of the voltage.

With the current supply controlled by the switching element SEL, the resistance value of the magnetic tunnel junction element MTJ can be switched between the low resistance state and high resistance state. The magnetic tunnel junction element MTJ is designed to be data-writable in accordance with the change of the resistance state of the element, and functions as a readable memory element by storing the written data in a non-volatile manner.

Figure 3:
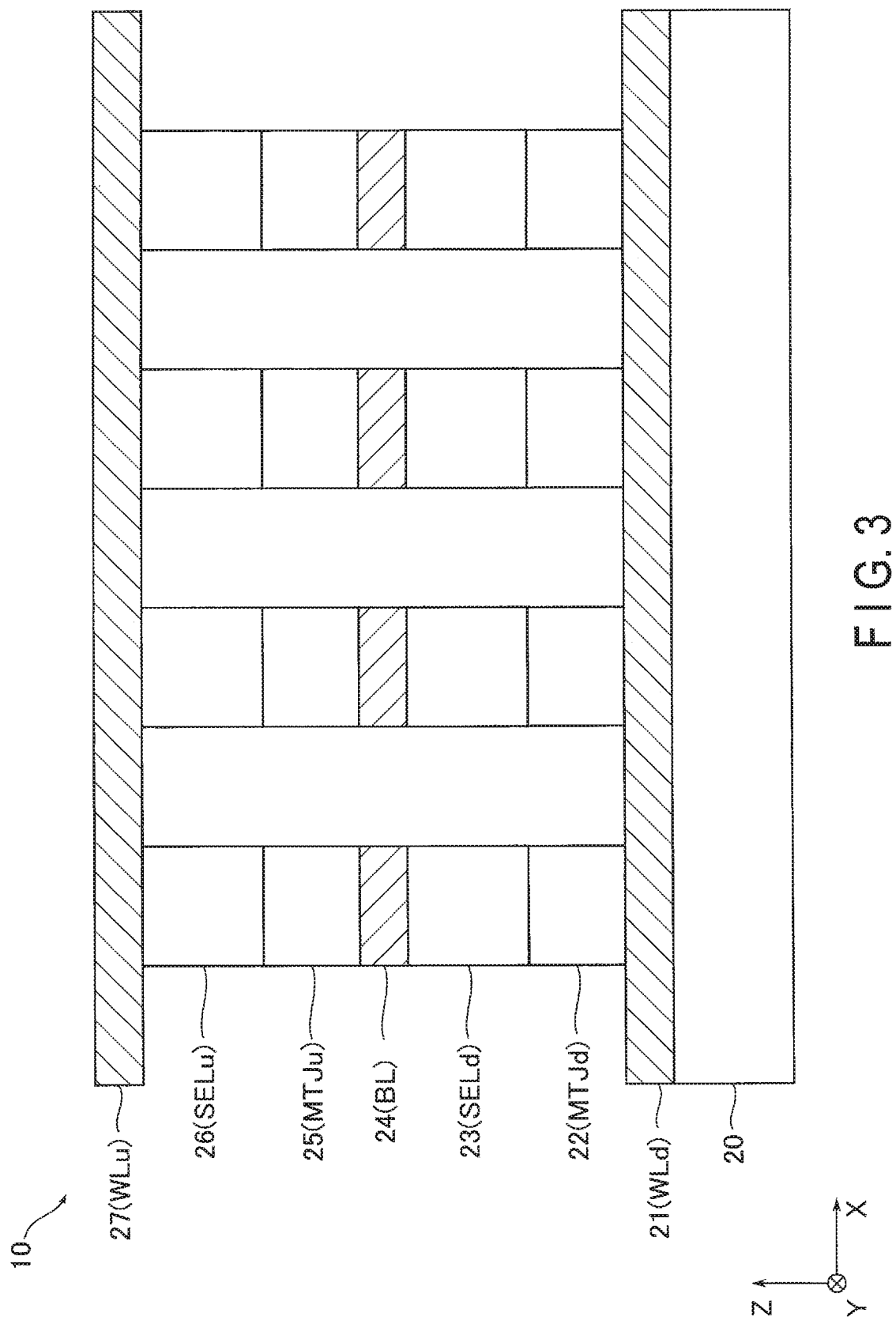
FIG. 3 is a cross sectional view for explaining the structure of the memory cell array in the magnetic memory device according to the present embodiment.
Figure 4:
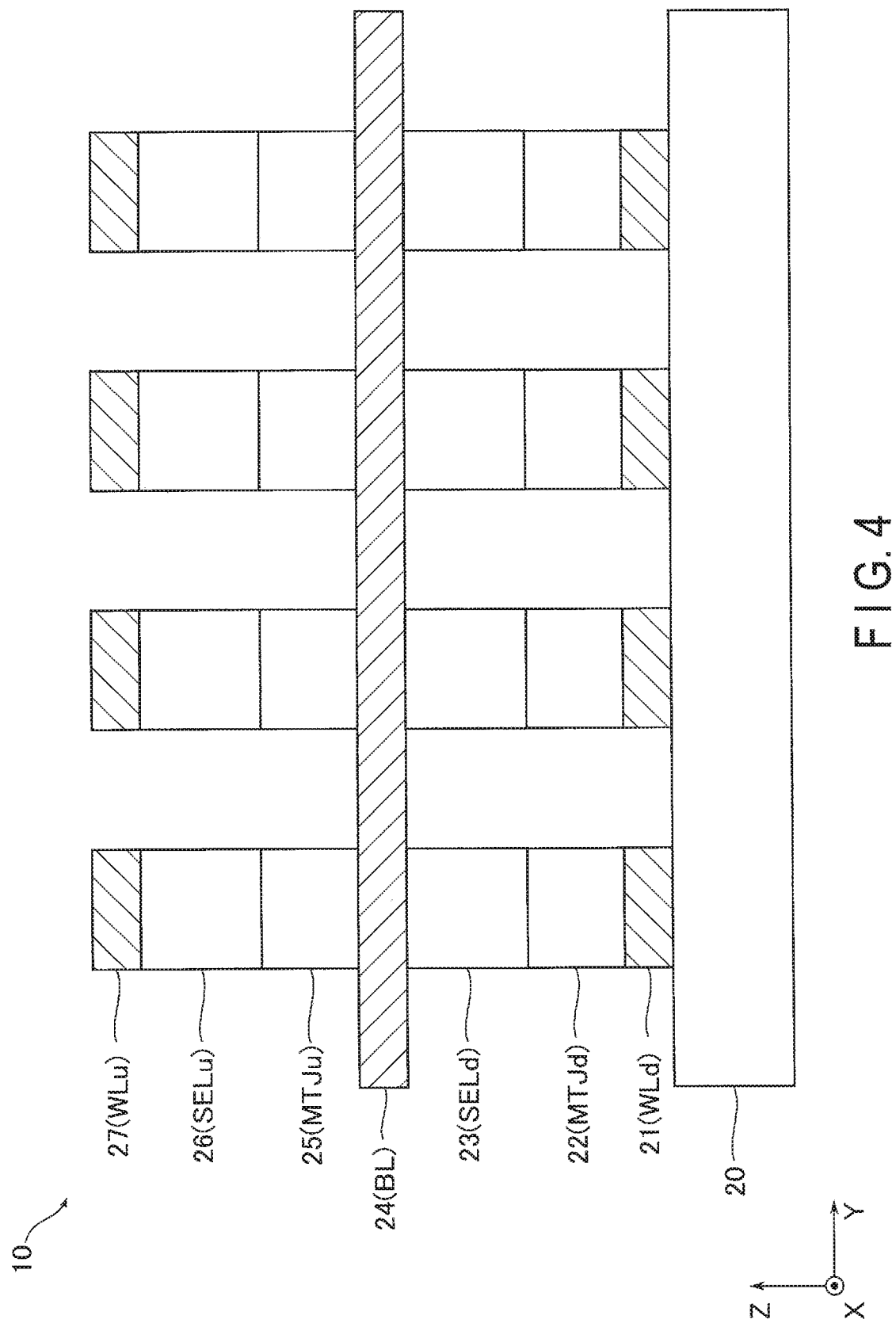
FIG. 4 is a cross sectional view for explaining the structure of the memory cell array in the magnetic memory device according to the present embodiment.

Next, the cross-sectional structure of the memory-cell array 10 will be explained with reference to FIGS. 3 and 4, which are cross sectional views of an exemplary structure of the memory cell array in the magnetic memory device according to the present embodiment. FIGS. 3 and 4 present cross sections of the memory cell array 10 viewed from different directions that intersect each other.

As illustrated in FIGS. 3 and 4, the memory cell array 10 is arranged on a semiconductor substrate 20. In the following explanation, a plane parallel to the surface of the semiconductor substrate 20 will be referred to as an "XY plane", and the axis perpendicular to the XY plane will be referred to as a "Z-axis". On the XY plane, the axis extending along the word line WL will be referred to as an "X-axis", and the axis extending along the bit line BL will be referred to as a "Y-axis". In other words, FIGS. 3 and 4 are the cross sections of the memory cell array 10 when viewed along the Y-axis and X-axis, respectively.

A plurality of conductors 21 are arranged on the upper surface of the semiconductor substrate 20. The conductors 21 are conductive, and function as word lines WLd. The conductors 21 may be aligned in the Y-axis direction, each extending along the X-axis. The conductors 21 in FIGS. 3 and 4 are arranged in contact with the semiconductor substrate 20, but the arrangement is not limited thereto. The conductors 21 may be arranged above the semiconductor substrate 20 without being in contact therewith.

A plurality of elements 22 are arranged on the upper surface of a conductor 21 to individually function as a magnetic tunnel junction element MTJd. The elements 22 on the conductor 21 may be aligned in the X-axis direction. In other words, the elements 22 are arranged on one conductor 21 in the X-axis direction and are commonly coupled thereto. The structure of an element 22 will be discussed later in detail.

A plurality of elements 23 are provided on the upper surface of the respective elements 22 to function as switching elements SELd. The upper surface of each element 23 is coupled to one of the conductors 24. The conductors 24 are conductive and function as bit lines BL. The conductors 24 may be aligned in the X-axis direction, each extending along the Y-axis. That is, the elements 23 aligned along the Y-axis are commonly coupled to one conductor 24. In FIGS. 3 and 4, individual elements 23 are arranged on the upper surface of the elements 22 and on the bottom surface of the conductor 24, but the arrangement is not limited thereto. Each element 23 may be coupled to the elements 22 and conductor 24 with conductive contact plugs (not shown) interposed between.

A plurality of elements 25 are arranged on the upper surface of a conductor 24 so as to individually function as a magnetic tunnel junction element MTJu. The elements 25 arranged on the upper surface of a conductor 24 may be aligned in the X-axis direction. That is, the elements 25 aligned in the Y-axis direction are commonly coupled to the upper surface of one conductor 24. An element 25 may have a structure similar to an element 22.

Elements 26 are provided on the upper surface of the respective elements 25 so as to function as switching elements SELu. The upper surface of the elements 26 is coupled to one of the conductors 27. The conductors 27 are conductive, and function as word lines WLu. The conductors 27 may be aligned in the Y-axis direction, each extending along the X-axis. That is, the elements 26 aligned in the X-axis direction are commonly coupled to one conductor 27.

In FIGS. 3 and 4, individual elements 26 are arranged on the upper surface of the elements 25 and on the bottom surface of the conductor 27, but the arrangement is not limited thereto. Each element 26 may be coupled to the elements 25 and conductor 27 with conductive contact plugs (not shown) interposed between.

With the above arrangement, a pair of word lines WLd and WLu corresponds to one bit line BL in the memory cell array 10. Furthermore, in the memory cell array 10, a memory cell MCd is arranged between a word line WLd and a bit line BL, and a memory cell MCu is arranged between a bit line BL and a word line WLu. This means that the memory cell array 10 has a structure in which memory cells MC are arranged at different levels along the Z-axis. In the cell structure of FIGS. 3 and 4, the memory cells MCd correspond to the lower layer, and the memory cells MCu correspond to the upper layer. Of the two memory cells MC commonly coupled to one bit line BL, the memory cell MC in the upper layer with respect to the bit line BL corresponds to a memory cell MCu with the alphabetic character "u" attached, while the memory cell MC in the lower layer corresponds to a memory cell MCd with "d" attached.

1.1.3 Magnetic Tunnel Junction Element

Figure 5:
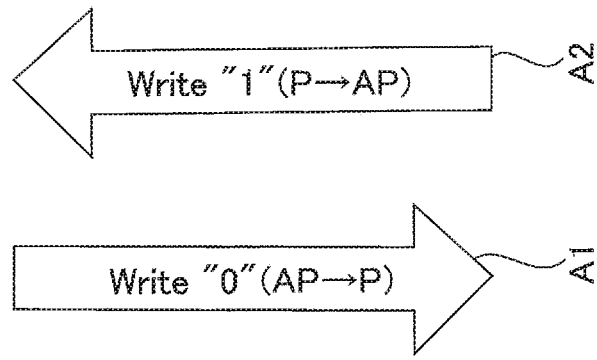
FIG. 5 is a cross sectional view for explaining a structure of a magnetic tunnel junction element in the magnetic memory device according to the present embodiment.
Figure 5:
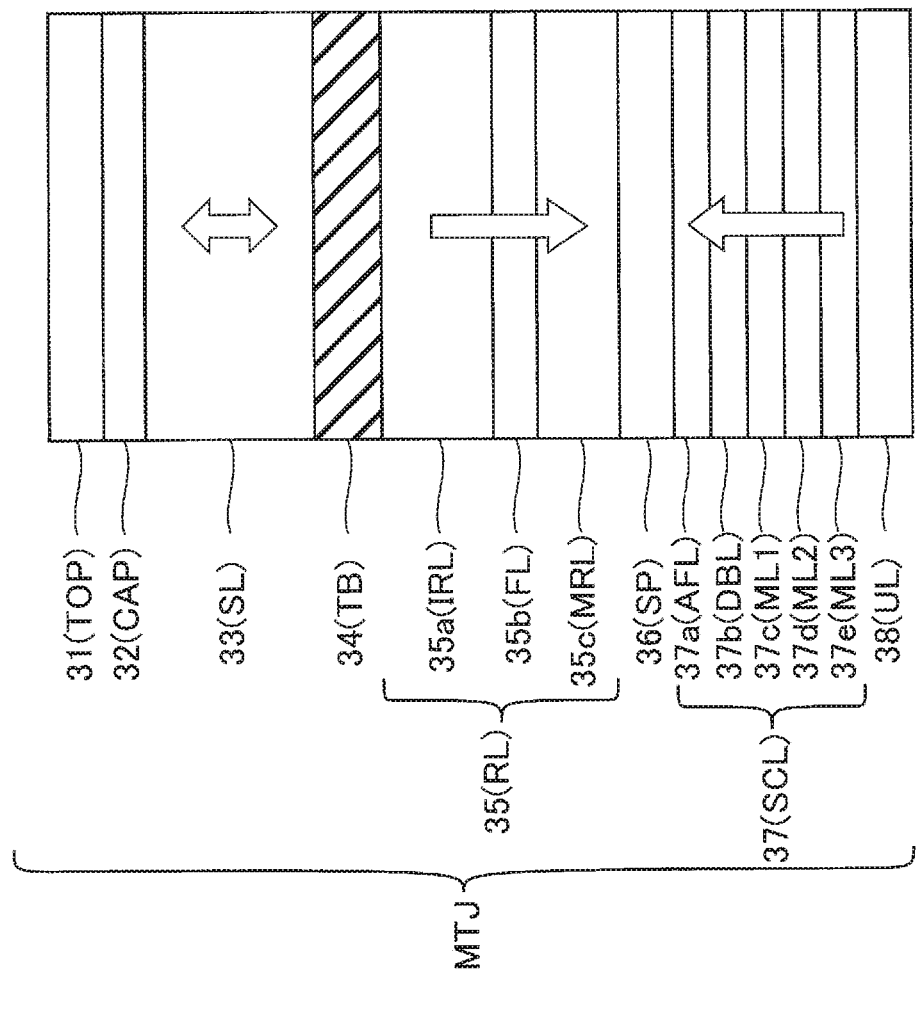

Next, the structure of a memory cell array in the magnetic memory device according to the present embodiment will be explained with reference to FIG. 5, which is a cross sectional view of the structure of a magnetic tunnel junction element in the magnetic memory device according to the present embodiment. FIG. 5 presents an exemplary cross section of the magnetic tunnel junction elements MTJd in FIGS. 3 and 4, taken along a plane perpendicular to the Z-axis (e.g., XZ plane). The magnetic tunnel Junction element MTJu has a structure similar to that of the magnetic tunnel junction element MTJd, and therefore the illustration thereof is omitted.

As illustrated in FIG. 5, the magnetic tunnel junction element MTJ may include a non-magnetic layer 31 that functions as a top layer TOP; a non-magnetic layer 32 that functions as a capping layer CAP; a ferromagnetic layer that functions as a storage layer SL; a non-magnetic layer 34 that functions as a tunnel barrier layer TB; a layer stack 35 that functions as a reference layer RL; a non-magnetic layer 36 that functions as a spacer layer SP; a layer stack 37 that functions as a shift cancelling layer SCL; and a non-magnetic layer 38 that functions as an under layer UL. Each of the storage layer SL, reference layer RL and shift cancelling layer SCL can be regarded as a ferromagnetic body.

In the magnetic tunnel junction element MTJd, multiple layers including the non-magnetic layer 38, layer stack 37, non-magnetic layer 36, layer stack 35, non-magnetic layer 34, ferromagnetic layer 33, non-magnetic layer 32 and non-magnetic layer 31 may be stacked in this order from the word line WLd side to the bit line BL side (in the Z-axis direction). In the magnetic tunnel junction element MTJu, multiple layers including the non-magnetic layer 38, layer stack 37, non-magnetic layer 36, layer stack 35, non-magnetic layer 34, ferromagnetic layer 33, non-magnetic layer 32 and non-magnetic layer 31 may be stacked in this order from the bit line BL side to the word line WLu side (in the Z-axis direction). The magnetic tunnel junction elements MTJd and MTJu may function as magnetic MTJ elements of perpendicular magnetization type, in which the magnetization directions of the magnets constituting the magnetic tunnel junction elements MTJd and MTJu, respectively, are perpendicular to the film surface. The magnetic tunnel junction element MTJ may further include layers that are not shown between the layers 31 to 38.

The non-magnetic layer 31 is a non-magnetic conductor, functioning as a top electrode that enhances the electric connectivity between the upper end of the magnetic tunnel junction element MTJ and the bit line BL or word line WL. The non-magnetic layer 31 may contain at least one element or compound selected from tungsten (W), tantalum (Ta), tantalum nitride (TaN), titanium (Ti) and titanium nitride (TiN).

The non-magnetic layer 32 is a non-magnetic layer having a function of suppressing an increase of the damping constant of the ferromagnetic layer 33 and reducing the write current. The non-magnetic layer 32 may contain at least one nitride or oxide selected from magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN) and vanadium nitride (VN). The non-magnetic layer 32 may be a mixture of any of these nitrides and oxides. That is, the non-magnetic layer 32 is not limited to a binary compound containing two types of element, and may be a ternary compound containing three types of elements such as titanium aluminum nitride (Al-TiN).

The ferromagnetic layer 33 exhibits ferromagnetism, and has an easy axis of magnetization in a direction perpendicular to the film surface. The ferromagnetic layer 33 has a magnetization direction along the Z-axis, in a direction toward either the bit line BL side or the word line WL. The ferromagnetic layer 33 contains at least one of iron (Fe), cobalt (Co) and nickel (Ni). The ferromagnetic layer 33 further contains boron (B).

In particular, the ferromagnetic layer 33 may include iron cobalt boron (FeCoB) or iron boride (FeB), having a body-centered cubic crystal structure.

The non-magnetic layer 34 is a non-magnetic insulator containing, for example, magnesium oxide (MgO), and may further include boron (B). The non-magnetic layer 34 has a NaCl crystal structure in which the film surface is oriented in the (001) plane, and serves as a seed or a core for growing a crystalline film from the interface with respect to the ferromagnetic layer 33 in the crystallizing process of the ferromagnetic layer 33. The non-magnetic layer 34 arranged between the ferromagnetic layer 33 and layer stack 35 forms a magnetic tunnel junction together with these two ferromagnetic layers.

The layer stack 35 can be regarded as a single ferromagnetic layer, having an easy axis of magnetization extending in the direction perpendicular to the film surface. The layer stack 35 has a magnetization direction along the Z-axis, extending in a direction toward either the bit line BL side or the word line WL side. The layer stack 35 has a fixed magnetization direction. In the example of FIG. 5, this magnetization direction is indicated as being toward the layer stack 37. "Fixed magnetization direction" indicates the magnetization direction being unchanged even by a current (spin torque; large enough to reverse the magnetization direction of the ferromagnetic layer 33.

In particular, the layer stack 35 includes a ferromagnetic layer 35a functioning as an interface layer IL, a non-magnetic layer 35b functioning as a function layer FL, and a ferromagnetic layer 35c functioning as a main reference layer MRL. For instance, the ferromagnetic layer 35c, non-magnetic layer 35b, and ferromagnetic layer 35a are stacked in this order between the upper surface of the non-magnetic layer 36 and the bottom surface of the non-magnetic layer 34.

The ferromagnetic layer 35a is a ferromagnetic conductor, and may include at least one of iron (Fe), cobalt (Co) and nickel (Ni). The ferromagnetic layer 35a may further include boron (B). In particular, the ferromagnetic layer 35a may include iron cobalt boron (FeCoB) or iron boride (FeB), having a body-centered cubic crystal structure.

The non-magnetic layer 35b is a non-magnetic conductor, and may contain at least one metal selected from tantalum (Ta), hafnium (Hf), tungsten (W), zirconium (Zr), molybdenum (Mo), niobium (Nb) and titanium (Ti). The non-magnetic layer 35b has a function of maintaining exchange interaction between the ferromagnetic layer 35a and ferromagnetic layer 35c.

The ferromagnetic layer 35c may include at least one multi-layer film selected from a multi-layer film (Co/Pt multi-layer film) containing cobalt (Co) and platinum (Pt), a multi-layer film (Co/Ni multi-layer film) containing cobalt (Co) and nickel (Ni), and a multi-lager film (Co/Pd multi-layer film) containing cobalt (Co) and palladium (Pd).

The non-magnetic layer 36 is a non-magnetic conductor, including at least one element selected from ruthenium (Ru), osmium (Os), rhodium (Rh), iridium (Ir), vanadium (V) and chromium (Cr).

The layer stack 37 can be regarded as a single ferromagnetic layer, having an easy axis of magnetization extending in the direction perpendicular to the film surface. The layer stack 37 has a magnetization direction along the Z-axis, extending in a direction toward either the bit line BL side or the word line WL side. In a similar manner to the layer stack 35, the layer stack 37 has a fixed magnetization direction. In the example of FIG. 5, this magnetization direction is indicated as being toward the layer stack 35.

In particular, the layer stack 37 includes a ferromagnetic layer 37a functioning as an anti-ferromagnetic coupling layer AFL; a non-magnetic layer 37b functioning as a diffusion barrier layer DBL; and also a ferromagnetic layer 37c (ML1), a non-magnetic layer 37d (ML2) and a ferromagnetic layer 37e (ML3), each of which functions as a multi-layer ML. The ferromagnetic layer 37e, non-magnetic layer 37d, ferromagnetic layer 37c, non-magnetic layer 37b and ferromagnetic layer 37a may be stacked in this order between the upper surface of the non-magnetic layer 38 and the bottom surface of the non-magnetic layer 36.

The ferromagnetic layer 37a is a ferromagnetic conductor having a hexagonal close-packed (hcp) crystal structure or face-centered cubic (fcc) crystal structure, and may contain cobalt (Co). The ferromagnetic layers 35c and 37a are antiferromagnetically coupled to each other by the non-magnetic layer 36. In other words, the ferromagnetic layers 35c and 37a are coupled so as to have magnetization directions antiparallel to each other. In the example of FIG. 5, the magnetization directions of the ferromagnetic layers 35c and 37a face each other. Such a structure of the ferromagnetic layer 35c, non-magnetic layer 36, and ferromagnetic layer 37a coupled together is referred to as a "synthetic anti-ferromagnetic (SAF) structure".

The non-magnetic layer 37b is a non-magnetic conductor having an amorphous structure, and may include at least one element selected from titanium (Ti), vanadium (V), chromium (Cr), zirconium (Zr), niobium (Nb), molybdenum (Mo), technetium (Tc), ruthenium (Ru), rhodium (Rh), hafnium (Hf), tantalum (Ta), tungsten (W), rhenium (Re), osmium (Os) and iridium (Ir). In addition, the non-magnetic layer 37b may include a nitride of at least one element selected from titanium (Ti), vanadium (V), chromium (Cr), zirconium (Zr), niobium (Nb), molybdenum (Mo), technetium (Tc), ruthenium (Ru) rhodium (Rh), hafnium (Hf), tantalum (Ta), tungsten (W), rhenium (Re), osmium (Os) and iridium (Ir). If the non-magnetic layer 37b can be designed with a thickness sufficiently small to have little influence on the crystal structure of the ferromagnetic layer 37a, the non-magnetic layer 37b may have a crystal structure different from the crystal structure aforementioned. The above element of the non-magnetic layer 37b (at least of an element or a nitride of the element selected from titanium (Ti), vanadium (V), chromium (Cr), zirconium (Zr), niobium (Nb), molybdenum (Mo), technetium (Tc), ruthenium (Ru), rhodium (Rh), hafnium (Hf), tantalum (Ta), tungsten (W), rhenium (Re), osmium (Os) and iridium (Ir)) may exhibit a melting point higher than at least the melting point of the non-magnetic layer 37d. More preferably, the melting point of this element is higher than the melting points of iron (Fe) and cobalt (Co). Furthermore, the non-magnetic layer 37b has an amorphous structure that does not include crystal grain boundaries in which elements can be easily diffused. As a result, the substance in the non-magnetic layer 37b diffuses only minimally to other layers even in the environment of a high temperature, and suppresses the passage of elements diffused from other layers into the non-magnetic layer 37b.

The ferromagnetic layer 37c is a ferromagnetic conductor, and may contain cobalt (Co). The ferromagnetic layer 37c is magnetically coupled to the ferromagnetic layer 37a, exhibiting the same magnetization direction as that of the ferromagnetic layer 37a.

The non-magnetic layer 37d is a non-magnetic conductor, and may include at least one element selected from platinum (Pt), nickel (Ni) and palladium (Pd). The non-magnetic layer 37d has a function of maintaining the exchange interaction between the ferromagnetic layer 37c and the ferromagnetic layer 37e. The ferromagnetic layer 37e is a ferromagnetic conductor and may include cobalt (Co).

In the example of FIG. 5, a pair of the non-magnetic layer 37d and ferromagnetic layer 37e is illustrated as being stacked. The structure, however, may include multiple pairs of the non-magnetic layers 37d and ferromagnetic layers 37e stacked.

In other words, multiple pairs of non-magnetic layers 37d and ferromagnetic layers 37e may form at least one multi-layer film selected from a multi-layer film (Pt/Co multi-layer film) of platinum (Pt) and cobalt (Co), a multi-layer film (Ni/Co multi-layer film) of nickel (Ni) and cobalt (Co), and a multi-layer film (Pd/Co multi-layer film) of palladium (Pd) and cobalt (Co).

With the above structure, the layer stack 37 can cancel out the influence of the stray field from the layer stack 35 upon the ferromagnetic layer 33 in the magnetization direction. The stray field of the layer stack 35 tends to exhibit asymmetric characteristics in a magnetic reversal of the ferromagnetic layer 33. In other words, with the stray field, the tendency of the magnetic reversal of the ferromagnetic layer 33 in one direction may differ from the tendency of the magnetic reversal in the opposite direction. The layer stack 37, however, can suppress such an asymmetrical tendency.

The non-magnetic layer 38 is a non-magnetic conductor, and functions as an electrode that enhances the electric connectivity with the bit lines BL and word lines WL. The non-magnetic layer 38 further includes a metal demonstrating a high melting point. A high melting point metal may be a material that demonstrates a melting point higher than iron (Fe) and cobalt (Co). Such a material includes at least one element selected from zirconium (Zr), hafnium (Hf), tungsten (W), chrome (Cr), molybdenum (Mo), niobium (Nb), titanium (Ti), tantalum (Ta), vanadium (V), ruthenium (Ru) and platinum (Pt).

According to the embodiment, a spin injection write system is adopted, in which the write current is directly fed into the above magnetic tunnel junction element MTJ to inject a spin torque into the storage layer SL and reference layer RL, thereby controlling the magnetization directions of the storage layer SL and the reference layer RL. The magnetic tunnel junction element MTJ may be either in the low resistance state or high resistance state, depending on whether the magnetization directions of the storage layer SL and reference layer RL indicate a parallel or antiparallel relationship with each other.

When a write current Ic0 of a certain level is fed into the magnetic tunnel junction element MTJ in the direction of arrow A1 in FIG. 5, or, in other words, the direction from the storage layer SL toward the reference layer RL, the magnetization directions of the storage layer SL and reference layer RL demonstrate a parallel relationship. In a parallel state, the resistance of the magnetic tunnel junction element MTJ takes the minimal value, which sets the magnetic tunnel junction element MTJ to the low resistance state. This low resistance state is referred to as a "parallel state (P state)", in which the data state is defined as "0", for example.

When a write current Ic1 larger than the write current Ic0 is fed into the magnetic tunnel junction element MTJ in the direction of arrow A2 in FIG. 5, or in other words, the direction from the reference layer RL toward the storage layer SL (i.e., direction opposite to arrow A1), the magnetization directions of the storage layer SL and reference layer RL demonstrate an antiparallel relationship. In the antiparallel state, the resistance of the magnetic tunnel junction element MTJ takes the maximum value, which sets the magnetic tunnel junction element MTJ to the high resistance state. This high resistance state is referred to as an "antiparallel (AP) state", in which the data state is defined as "1", for example.

The following explanation is given in accordance with the above data defining method. The definition of data "1" and data "0", however, is not limited to the above example. For instance, the P state may be defined as having data "1", and the AP state may be defined as having data "0".

1.2 Manufacturing Method of Magnetic Tunnel Junction Element

Next, the method of manufacturing a magnetic tunnel junction element of the magnetic memory device according to the present embodiment will be explained.

The following explanation will focus particularly on the method of manufacturing the layers from the non-magnetic layer 38 (under layer UL) up to the ferromagnetic layer 35a (interface reference layer IRL) among the structural components f the magnetic tunnel junction element MTJ, with the non-magnetic layer 34 and upper layers omitted from the explanation.

Figure 6:
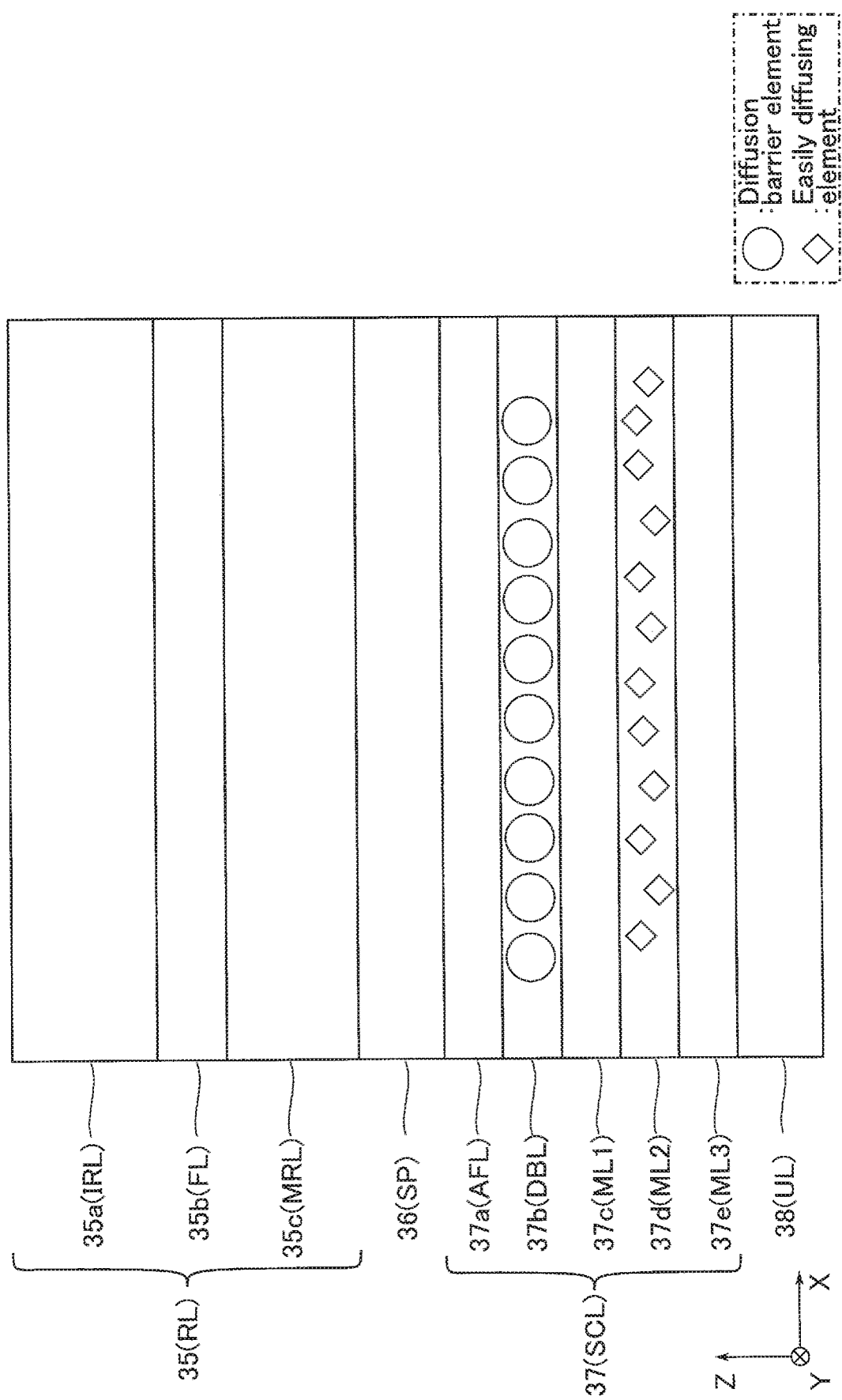
FIG. 6 is a schematic diagram for explaining a method for manufacturing a magnetic tunnel junction element of the magnetic memory device according to the present embodiment.

FIGS. 6 and 7 are schematic diagrams for explaining the method of manufacturing the magnetic tunnel junction element of the magnetic memory device according to the present embodiment. These drawings show the layer structure before and after annealing, respectively. This layer structure is intended to function as a magnetic tunnel junction element MTS.

As illustrated in FIG. 6, the non-magnetic layer 38, ferromagnetic layer 37e, non-magnetic layer 37d, ferromagnetic layer 37c, non-magnetic layer 37b, ferromagnetic layer 37a, non-magnetic layer 36, ferromagnetic layer 35c, non-magnetic layer 35b and ferromagnetic layer 35a are stacked in this order above the semiconductor substrate 20.

As mentioned earlier, the non-magnetic layer 37b contains an element ("diffusion barrier element" illustrated with circles in FIG. 6) that diffuses only minimally, even in a high-temperature environment, and suppresses diffusion of elements from other layers. In contract, the non-magnetic layer 37d contains an element ("easily diffusing element" illustrated as with rhomboids in FIG. 6) capable of easily diffusing into other layers in the environment of a high temperature.

As illustrated in FIG. 7, annealing is conducted upon the layer structure of FIG. 6, as a result of which the properties of a magnetic tunnel junction element MTJ are imparted to the layer structure.

With the heat externally applied to the layers of the structure through annealing, the easily diffusing element of the non-magnetic layer 37d tends to diffuse to other layers.

If the easily diffusing element that diffuses into the non-magnetic layer 36 or ferromagnetic layer 35a, however, it may degrade the performance of the magnetic tunnel junction element MTJ.

According to the present embodiment, the non-magnetic layer 37b containing a diffusion barrier element is arranged between the non-magnetic layer 37d and non-magnetic layer 36, and between the non-magnetic layer 37d and ferromagnetic layer 35a. In this manner, outflow of the easily diffusing element from the non-magnetic layer 37b is prevented. Thus, both the inclusion of the easily diffusing element as impurities in the non-magnetic layer 36 and ferromagnetic layer 35a, and, consequently, the degradation in the properties of the magnetic tunnel junction elements MTJ can be suppressed.

1.3. Effects of Present Embodiment

According to the present embodiment, a magnetic tunnel junction element MTJ with its tunnel magnetoresistance ratio TMR enhanced can be manufactured. The effects of the present embodiment will be described below with reference to FIG. 8.

FIG. 8 is a diagram showing the effects of the present embodiment. The horizontal axis of the graph of FIG. 8 indicates the temperature (annealing temperature) of the heat applied to the magnetic tunnel junction element MTJ during the annealing, while the vertical axis indicates the tunnel magnetoresistance ratio TMR of the magnetic tunnel junction element MTJ, with the lines L1 and L2 plotted. Line L1 corresponds to the tunnel magnetoresistance ratio TMR of the magnetic tunnel junction element MTJ according to the present embodiment, and line L2 corresponds to the tunnel magnetoresistance ratio TMR of a magnetic tunnel junction element MTJ of a comparative example. The magnetic tunnel junction element MTJ of the comparative example does not include a non-magnetic layer 37b. In FIG. 8, the tunnel magnetoresistance ratios TMR of lines L1 and L2 are each normalized with respect to the tunnel magnetoresistance ratio TMR at the annealing temperature T0.

As illustrated in FIG. 8, the tunnel magnetoresistance ratio TMR continues to increase (improve) from the value corresponding to temperature T0 at a similar rate in both the present embodiment and the comparative example, under the environment up to the annealing temperature T1, which is higher than temperature T0 (T1>T0). This is because crystallization of a higher quality can be achieved in the ferromagnetic layer 33, non-magnetic layer 34 and ferromagnetic layer 35a with a higher annealing temperature. When the annealing temperature is T2, which is higher than T1 (T2>T1), the tunnel magnetoresistance ratio TMR in the comparative example is lowered in comparison with that at T1. This is because in accordance with the increased temperature of heat applied during the annealing, the amount of diffusion of an easily diffusing element of the non-magnetic layer 37d, such as platinum (Pt), into the ferromagnetic layer 35a is increased. As a result, the increased amount of the easily diffusing element in the ferromagnetic layer 35a lowers the spin polarizability of the ferromagnetic layer 35a.

In contrast, according to the present embodiment, when the annealing temperature is T2, the tunnel magnetoresistance ratio TMR can be further improved with respect to T1. Such an improvement can be attained due to the non-magnetic layer 37b suppressing the diffusion of the easily diffusing element of the non-magnetic layer 37d into the ferromagnetic layer 35a, which suppresses the reduction, due to the presence of the easily diffusing element, of the spin polarizability of the ferromagnetic layer 35a.

Thus, according to the present embodiment, the tunnel magnetoresistance ratio TMR can be improved even at the annealing temperature T2, at which the tunnel magnetoresistance ratio TMR is degraded in the comparative example.

Furthermore, according to the present embodiment, a magnetic tunnel junction element MTJ having an SAF structure with a high coupling energy can be manufactured. This effect of the present embodiment will be described below with reference to FIG. 9.

In the same manner as in FIG. 8, the horizontal axis of the graph of FIG. 9 indicates an annealing temperature, while the vertical axis indicates the coupling energy Jex of the anti-ferromagnetic coupling in the magnetic tunnel junction element MTJ. Lines L3 and L4 are plotted. Line L3 corresponds to the coupling energy Jex of the magnetic tunnel junction element MTJ according to the present embodiment, while line L4 corresponds to the coupling energy Jex of the magnetic tunnel junction element MTJ according to the comparative example. In the same manner as in FIG. 8, the magnetic tunnel junction element MTJ of the comparative example does not include a non-magnetic layer 37b. In FIG. 9, each coupling energy Jex of lines L3 and L4 is normalized with respect to the coupling energy Jex at the annealing temperature T0.

As illustrated in FIG. 9, the coupling energy Jex is lowered in the comparative example, as the annealing temperature increases from T0 to T1, and further increases from T1 to T2. This is because the amount of diffusion of the easily diffusing element of the non-magnetic layer 37d, such as platinum (Pt), into the non-magnetic layer 36 increases in accordance with the increase of the temperature of the heat applied during the annealing. The increased amount of the easily diffusing element in the non-magnetic layer 36 lowers this layer's function of anti-ferromagnetically coupling the ferromagnetic layer 37a to the ferromagnetic layer 35c.

In contrast, according to the present embodiment, even if the annealing temperature increases from T0 to T1, and further from T1 to T2, the coupling energy Jex shows substantially no degradation. The non-magnetic layer 36 has a function of anti-ferromagnetically coupling the ferromagnetic layer 37a to the ferromagnetic layer 35c, and with the non-magnetic layer 37b suppressing the diffusion of the easily diffusing element of the non-magnetic layer 37d into the non-magnetic layer 36, the degradation of this function of the non-magnetic layer 36 can be prevented. Thus, according to the present embodiment, even at the annealing temperature T2, at which the coupling energy Jex tends to be degraded in the comparative example, degradation of the coupling energy Jex cart be prevented.

2. Modification Examples

The above embodiment is not a limitation, and various other modifications may be applied. Modification examples applicable to the above embodiment will be explained below. For the sake of simplicity, differences with respect to the embodiment will be focused on.

2.1 Modification Example 1

The magnetic tunnel junction element MTJ of the above embodiment is explained as having a top-free structure, in which the storage layer SL is arranged above the reference layer RL, but this is not a limitation. The magnetic tunnel junction element MTJ may have a bottom-free structure, in Which the storage layer SL is arranged below the reference layer RL.

Figure 10:
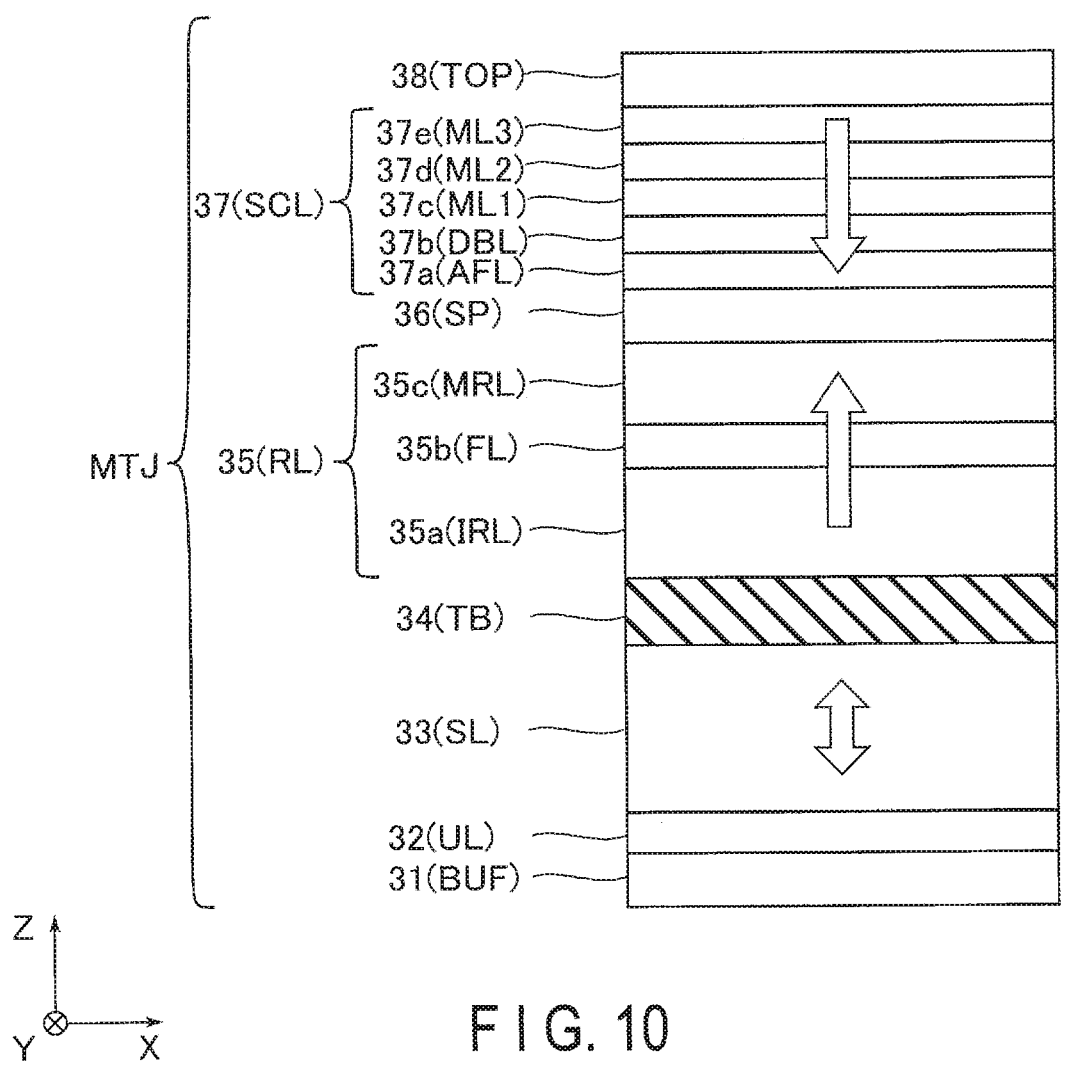
FIG. 10 is a cross sectional view for explaining a structure of a magnetic tunnel junction element in a magnetic memory device according to a first modification.

FIG. 10 is a cross sectional view for explaining the structure of a magnetic tunnel junction element in a magnetic memory device according to the first modification example. The structure of a magnetic tunnel junction element MTJ of a bottom-free type is illustrated in FIG. 10, which corresponds to the magnetic tunnel junction element MTJ of a top-free type explained with reference to FIG. 5.

As shown in FIG. 10, when the structure is of a bottom-free type, a plurality of layers including a non-magnetic layer 31 that functions as a buffer layer BUF, a non-magnetic layer 32 that functions as an under layer UL, a ferromagnetic layer 33 that functions as a storage layer SL, a non-magnetic layer 34 that functions as a tunnel barrier layer TB, a layer stack 35 that functions as a reference layer RL, a non-magnetic layer 36 that functions as a spacer layer SP, a layer stack 37 that functions as a shift cancelling layer SCL, and a non-magnetic layer 38 that functions as a top layer TOP are stacked in this order, from the word line WLd side to the bit line BL side (in the Z-axis direction) in a magnetic tunnel junction element MTJd, and from the bit line BL side to the word line WLu side (in the Z-axis direction) in a magnetic tunnel junction element MTJu. Furthermore, in the layer stack 35, a ferromagnetic layer 35a that functions as an interface reference layer IRL, a non-magnetic layer 35b that functions as a function layer FL, and a ferromagnetic layer 35c that functions as a main reference layer MRL are stacked in this order in the Z-axis direction. In the layer stack 37, a ferromagnetic layer 37a that functions as an anti-ferromagnetic coupling layer AFL, and a non-magnetic layer 37b that functions as a diffusion barrier layer DBL, as well as a ferromagnetic layer 37c, a non-magnetic layer 37d and a ferromagnetic layer 37e each of which functions as a multi-layer ML, are stacked in this order in the Z-axis direction. For the layers 31 to 38 of the first modification example, the materials similar to the layers 31 to 38, respectively, of the embodiment can be adopted. With the above structure, the effects similar to the embodiment can be produced in the magnetic tunnel junction element MTJ of a bottom-free type.

2.2 Modification Example 2

The memory cell MC according to the above embodiment incorporating a two-terminal switching element as a switching element SEL has been explained. In the memory cell MC, a metal oxide semiconductor (MOS) transistor may be adopted as a snitching element SEL.

That is, the structure of the memory cell array is not limited to a plurality of memory cells MC arranged at different heights in the Z-axis direction, and may adopt any array structure.

FIG. 11 is a circuit diagram for explaining the structure of a memory cell array in a magnetic memory device according to the second modification example. FIG. 11 corresponds to the memory cell array 10 in the magnetic memory device 1 according to the embodiment illustrated in FIG. 1.

As illustrated in FIG. 11, a memory cell array 10A includes a plurality of memory cells MC, each of which is associated with a row and a column. The memory cells MC in the same row are coupled to the same word line WL, and the two ends of the memory cells MC in the same column are coupled to the same bit line BL and to the same source line /BL.

FIG. 12 is a cross sectional view for explaining the structure of a memory cell in the magnetic memory device according to the second modification example. The structure of FIG. 12 corresponds to the memory cell MC of the embodiment described with reference to FIGS. 3 and 4. The memory cells MC do not have a stacking structure with respect to the semiconductor substrate in the example of FIG. 12, and "u" and "d" are therefore not attached to their symbols.

As illustrated in FIG. 12, the memory cell MC is arranged on a semiconductor substrate 40, and includes a selection transistor 41 (Tr) and a magnetic tunnel junction element 42 (MTJ). The selection transistor 41 is provided as a switch for controlling the supply and cutoff of the current at the time of writing and reading data to and from a magnetic tunnel junction element 42. The structure of the magnetic tunnel junction element 42 is the same as that of the magnetic tunnel junction element MTJ in the present embodiment as illustrated in FIG. 5 or in the first modification example as illustrated in FIG. 10.

The selection transistor 41 includes a gate (conductor 43) that serves as a word line WL, and a pair of a source region and drain region (diffusion regions 44) provided at the ends of this gate in the X-axis direction on the semiconductor substrate 40. The conductor 43 is provided on the insulator 45, which is in turn provided on the semiconductor substrate 40 to serve as a gate insulating film. The conductor 43 extends along the Y-axis, to which the gates of the selection transistors (not shown) of other memory cells MC aligned along the Y-axis are commonly coupled. The conductors 43 may be aligned along the X-axis. A contact plug 46 is provided on the diffusion region 44 at the first end of the selection transistor 41.

The contact plug 46 is coupled to the bottom surface (first end) of the magnetic tunnel junction element 42. A contact plug 47 is provided on the upper surface (second end) of the magnetic tunnel junction element 42, and the upper surface of the contact plug 47 is coupled to the conductor 48 that serves as a bit line BL. The conductor 48 extends along the X-axis, to which the second ends of the magnetic tunnel junction elements (not shown) of other memory cells aligned along the X-axis are commonly coupled. A contact plug 49 is provided on the diffusion region 44 at the second end of the selection transistor 41. The contact plug 49 is coupled to the bottom surface of the conductor 50 that serves as a source line /BL. The conductor 50 may extend along the X-axis, to which the second ends of the selection transistors (not shown) of other memory cells aligned along the X-axis may be commonly coupled. The conductors 48 and 50 may be aligned along the Y-axis. The conductor 48 may be positioned above the conductor 50. The conductors 48 and 50 are arranged in such a manner as to avoid physical and electrical interference from each other, although not illustrated in detail in FIG. 12. The selection transistor 41, magnetic tunnel junction element 42, conductors 43, 48 and 50, as well as contact plugs 46, 47 and 49, are coated with an interlayer insulating film 51. Other magnetic tunnel junction elements (not shown) aligned along the X-axis or Y-axis with respect to the magnetic tunnel junction element 42 are positioned on the same height level as the magnetic tunnel junction element 42. In other words, a plurality of magnetic tunnel junction elements 42 are arranged on the same XY plane in the memory cell array 10A.

With the above structure, effects similar to the embodiment can be produced even when a MOS transistor, which is a three-terminal switching element, is adopted for a switching element SEL in place of a two-terminal switching element.

2.3 Other Examples

The memory cells MC discussed in the above embodiment and modification examples are described as the magnetic tunnel junction elements MTJ arranged below the switching elements SEL. The magnetic tunnel junction elements MTJ, however, may be arranged above the switching elements SEL.

The magnetoresistance effect element discussed in the above embodiment and modification examples are described as the magnetic tunnel junction element. The magnetoresistance effect element, however, may be described as the memory element, using the magnetoresistance effect.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising a magnetoresistance effect element,
   the magnetoresistance effect element including:
   a first ferromagnetic layer;
   a second ferromagnetic layer;
   a third ferromagnetic layer;
   a first non-magnetic layer between the first ferromagnetic layer and the second ferromagnetic layer; and
   a second non-magnetic layer between the second ferromagnetic layer and the third ferromagnetic layer,
   wherein:
   the second ferromagnetic layer is between the first ferromagnetic layer and the third ferromagnetic layer,
   the third ferromagnetic layer includes:
   a fourth ferromagnetic layer in contact with the second non-magnetic layer;
   a third non-magnetic layer; and
   a fourth non-magnetic layer between the fourth ferromagnetic layer and the third non-magnetic layer,
   the first non-magnetic layer includes an oxide including magnesium (Mg),
   a melting point of the fourth non-magnetic layer is higher than a melting point of the third non-magnetic layer, and
   the second ferromagnetic layer and the third ferromagnetic later exhibit magnetization directions opposite to each other.

2. The device of claim 1, wherein the fourth non-magnetic layer is amorphous.

3. The device of claim 1, wherein the second non-magnetic layer includes at least one element selected from ruthenium (Ru), osmium (Os), rhodium (Rh), iridium (Ir), vanadium (V) and chromium (Cr).

4. The device of claim 1, wherein the fourth non-magnetic layer includes at least one element selected from titanium (Ti), vanadium (V), chromium (Cr), zirconium (Zr), niobium (Nb), molybdenum (Mo), technetium (Tc), ruthenium (Ru), rhodium (Rh), hafnium (Hf), tantalum (Ta), tungsten (W), rhenium (Re), osmium (Os) and iridium (Ir).

5. The device of claim 1, wherein the fourth non-magnetic layer includes a nitride of at least one element selected from titanium (Ti), vanadium (V), chromium (Cr), zirconium (Zr), niobium (Nb), molybdenum (Mo), technetium (Tc), ruthenium (Ru), rhodium (Rh), hafnium (Hf), tantalum (Ta), tungsten (W), rhenium (Re), osmium (Os) and iridium (Ir).

6. The device of claim 4, wherein the third non-magnetic layer includes at least one element selected from platinum (Pt), nickel (Ni) and palladium (Pd).

7. The device of claim 1, wherein the third ferromagnetic layer includes a fifth ferromagnetic layer between the third non-magnetic layer and the fourth non-magnetic layer.

8. The device of claim 7, wherein the fourth ferromagnetic layer and the fifth ferromagnetic layer include cobalt (Co).

9. The device of claim 1, wherein the first ferromagnetic layer and the second ferromagnetic layer include at least one element selected from iron (Fe), cobalt (Co) and nickel (Ni).

10. The device of claim 1, wherein the magnetoresistance effect element demonstrates a first resistance in accordance with a first current flowing from the first ferromagnetic layer to the second ferromagnetic layer, and demonstrates a second resistance in accordance with a second current flowing from the second ferromagnetic layer to the first ferromagnetic layer.

11. The device of claim 10, wherein the first resistance is lower than the second resistance.

12. The device of claim 1, wherein the first ferromagnetic layer is arranged above the second ferromagnetic layer.

13. The device of claim 1, wherein the first ferromagnetic layer is arranged below the second ferromagnetic layer.

14. The device of claim 1, comprising memory cells, each of the memory cells including:
   the magnetoresistance effect element; and
   a switching element coupled in series to the magnetoresistance effect element.

15. The device of claim 14, wherein the switching element is a two-terminal switching element.

16. The device of claim 14, wherein the switching element is a metal oxide semiconductor (MOS) transistor.

* * * * *